(12) United States Patent
Fukatsu et al.

(10) Patent No.: US 12,157,953 B2
(45) Date of Patent: Dec. 3, 2024

(54) INHIBITING DRIPPED GRANULAR DOPANT FROM ADHERING TO A GROWING SILICON SINGLE CRYSTAL BEFORE THE DOPANT MELTS

(71) Applicant: SUMCO CORPORATION, Tokyo (JP)

(72) Inventors: Norihito Fukatsu, Tokyo (JP); Ryusuke Yokoyama, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 294 days.

(21) Appl. No.: 17/640,054

(22) PCT Filed: Aug. 20, 2020

(86) PCT No.: PCT/JP2020/031409
§ 371 (c)(1),
(2) Date: Mar. 3, 2022

(87) PCT Pub. No.: WO2021/044855
PCT Pub. Date: Mar. 11, 2021

(65) Prior Publication Data
US 2022/0290323 A1   Sep. 15, 2022

(30) Foreign Application Priority Data

Sep. 6, 2019   (JP) ................. 2019-162971

(51) Int. Cl.
*C30B 15/04*   (2006.01)
*C30B 29/06*   (2006.01)
*C30B 30/04*   (2006.01)

(52) U.S. Cl.
CPC .............. *C30B 15/04* (2013.01); *C30B 29/06* (2013.01); *C30B 30/04* (2013.01)

(58) Field of Classification Search
CPC ......... C30B 15/00; C30B 15/02; C30B 15/04; C30B 15/20; C30B 29/00; C30B 29/02;
(Continued)

(56) References Cited

U.S. PATENT DOCUMENTS 5,858,087 A    1/1999  Taguchi et al.
2009/0235861 A1  9/2009  Fujiwara et al.

FOREIGN PATENT DOCUMENTS

CN    1160779 A    10/1997
CN    1165208 A    11/1997
(Continued)

OTHER PUBLICATIONS

IPRP for PCT/JP2020/031409, dated Mar. 8, 2022 (translation only).
(Continued)

*Primary Examiner* — Kenneth A Bratland, Jr.
(74) *Attorney, Agent, or Firm* — Greenblum & Bernstein, P.L.C

(57) ABSTRACT

There is provided a growing method for monocrystalline silicon by a Czochralski process, the method including: pulling the monocrystalline silicon while rotating the monocrystalline silicon; and dropping a granular dopant onto a liquid surface of a silicon melt while a straight body of the monocrystalline silicon is being pulled, in which in the dropping of the dopant, a dropping position of the granular dopant is set above a region where a flow away from the straight body is dominant in the liquid surface of the silicon melt.

7 Claims, 8 Drawing Sheets

(58) Field of Classification Search
CPC ......... C30B 29/06; C30B 30/00; C30B 30/04; C30B 35/00
USPC ... 117/11, 13, 19, 21, 30, 32, 200, 206, 208, 117/214, 928, 931–932
See application file for complete search history.

(56) References Cited

FOREIGN PATENT DOCUMENTS

| | | | |
|---|---|---|---|
| CN | 101225541 A | | 7/2008 |
| CN | 108166053 A | | 6/2018 |
| JP | H03-247585 A | | 11/1991 |
| JP | 04016588 A | * | 1/1992 |
| JP | H04-16588 A | | 1/1992 |
| JP | H09-183688 A | | 7/1997 |
| JP | 2009-221062 A | | 10/2009 |
| JP | 2010030860 A | * | 2/2010 |
| JP | 2011-037678 A | | 2/2011 |
| JP | 2013-163642 A | | 8/2013 |
| TW | 200722562 A | | 6/2007 |

OTHER PUBLICATIONS

Office Action for CN App. No. 202080062476.1, dated May 12, 2023 (w/ translation).
Yi, K. et al., "Change in Velocity in Silicon Melt of the Czochralski (CZ) Process in a Vertical Magnetic Field", Japanese Journal of Applied Physics, vol. 33, Apr. 1, 1994, pp. 487-490.
International Search Report issued in International Bureau of WIPO Patent Application No. PCT/JP2020/031409, dated Oct. 20, 2020, along with an English translation thereof.
Office Action for DE App. No. 112020004216.2, dated Nov. 7, 2023 (w/ translation).
Office Action for CN App. No. 202080062476.1, dated Apr. 1, 2024 (w/ translation).

* cited by examiner

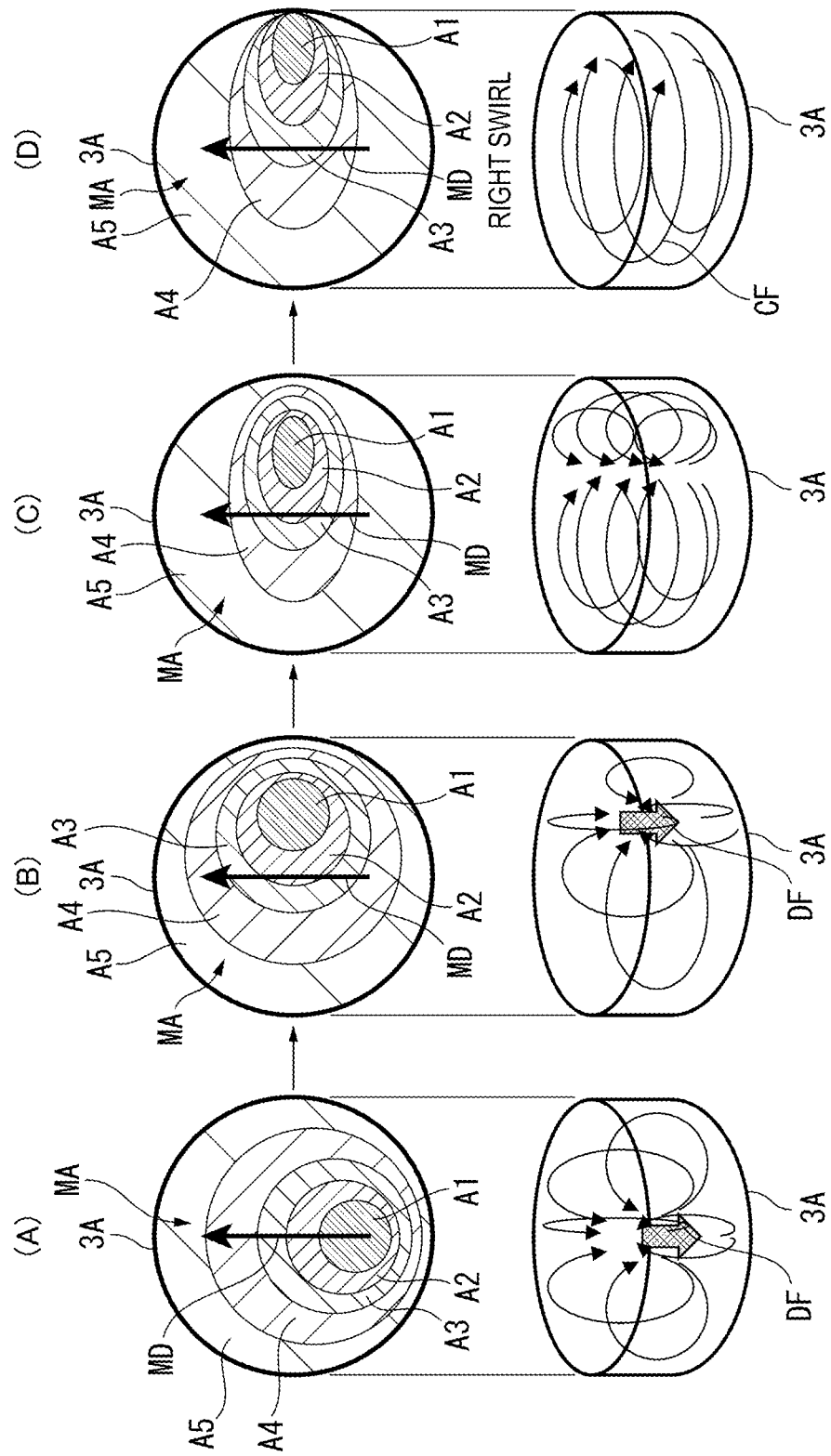

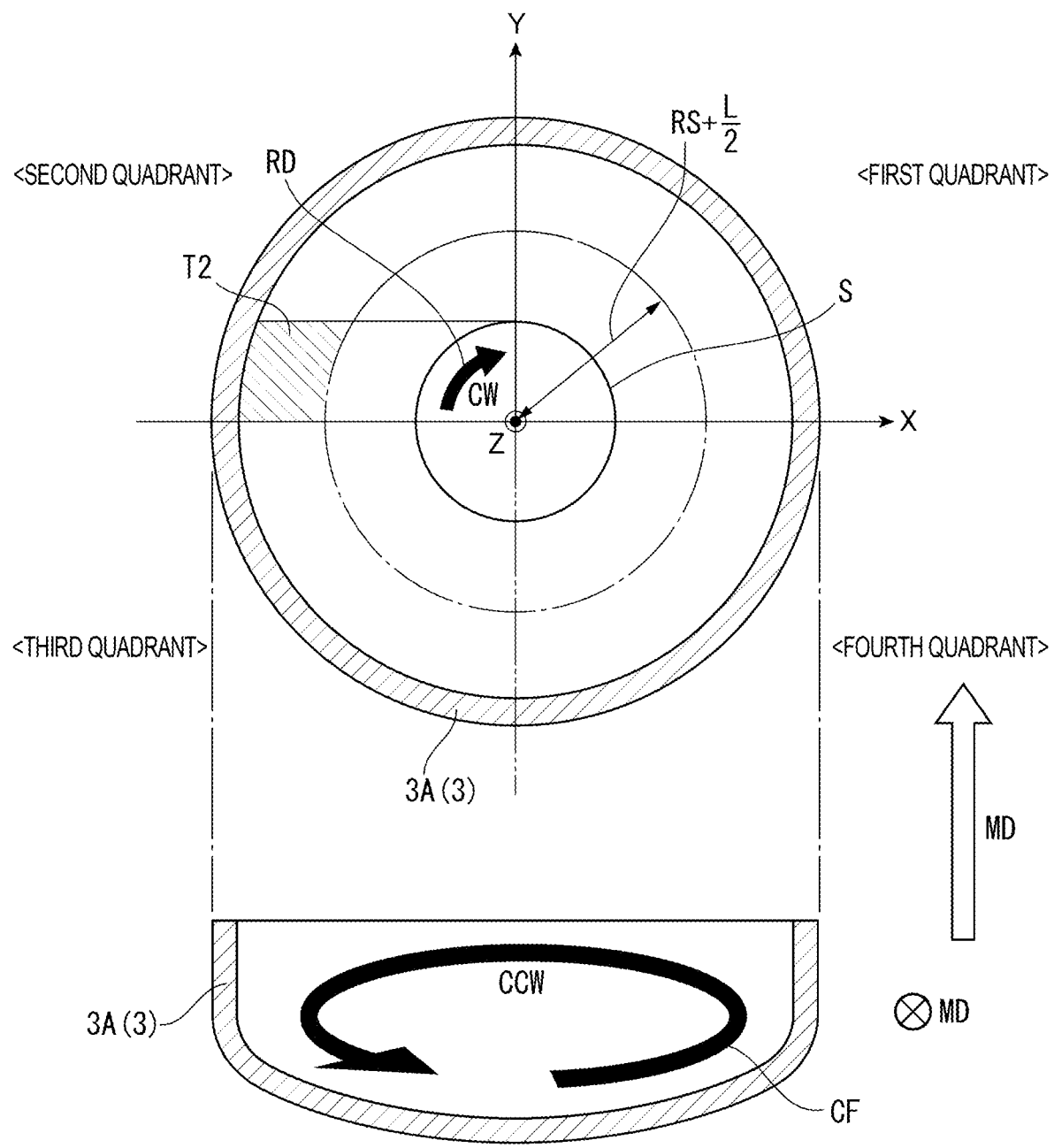

INHIBITING DRIPPED GRANULAR DOPANT FROM ADHERING TO A GROWING SILICON SINGLE CRYSTAL BEFORE THE DOPANT MELTS

TECHNICAL FIELD

The present invention relates to a growing method for monocrystalline silicon and a pulling device for monocrystalline silicon.

BACKGROUND ART

A method called the Czochralski process (hereinafter, CZ process) is used to manufacture monocrystalline silicon. In a manufacturing method using the CZ process, a resistivity of monocrystalline silicon is adjustable depending on a dopant added to a silicon melt. A known example of a method of adding a dopant to a silicon melt is a technology where a granular dopant is dropped while monocrystalline silicon is being pulled, thereby keeping a dopant concentration in the crystal constant.

CITATION LIST

Patent Literature(s)

Patent Literature 1: JP 3-247585 A

SUMMARY OF THE INVENTION

Problems to be Solved by the Invention

A typical technology is, however, disadvantageous in that, for instance, a granular dopant dropped into a silicon melt through a conduit would adhere to monocrystalline silicon without melting and cause dislocation.

An object of the invention is to provide a growing method for monocrystalline silicon and a pulling device for monocrystalline silicon that are capable of inhibiting, in growing monocrystalline silicon by the Czochralski process, a dropped granular dopant from adhering to the monocrystalline silicon before melting, and causing dislocation.

Means for Solving the Problems

A growing method for monocrystalline silicon according to an aspect of the invention, which is a growing method for monocrystalline silicon by a Czochralski process, includes: pulling the monocrystalline silicon while rotating the monocrystalline silicon; and dropping a granular dopant onto a liquid surface of a silicon melt while a straight body of the monocrystalline silicon is being pulled, in which a dropping position of the granular dopant is set above a region where a flow away from the straight body is dominant in the liquid surface of the silicon melt.

It is preferable that the growing method for the monocrystalline silicon further includes applying a horizontal magnetic field to the silicon melt, in which in the dropping of the dopant, in a state where in a right-handed XYZ orthogonal coordinate system where a center of the liquid surface of the silicon melt corresponds to an origin, an upper side in a vertical direction corresponds to a positive direction of a Z-axis, and a horizontal magnetic field application direction corresponds to a positive direction of a Y-axis, on a magnetic-field-orthogonal cross section including the origin and orthogonal to the horizontal magnetic field application direction, there is a convection flow having a clockwise or counterclockwise rotation direction as viewed from the positive direction of the Y-axis, the dropping position of the granular dopant is set based on a rotation direction of the monocrystalline silicon and the rotation direction of the convection flow as viewed from the upper side in the vertical direction.

In the growing method for the monocrystalline silicon, it is preferable that in the dropping of the dopant, in a case where the rotation direction of the convection flow is clockwise and the rotation direction of the monocrystalline silicon is clockwise, the dropping position is a fourth quadrant of a coordinate plane defined by an X-axis and the Y-axis, in a case where the rotation direction of the convection flow is counterclockwise and the rotation direction of the monocrystalline silicon is counterclockwise, the dropping position is a first quadrant of the coordinate plane, in a case where the rotation direction of the convection flow is counterclockwise and the rotation direction of the monocrystalline silicon is clockwise, the dropping position is a second quadrant of the coordinate plane, and in a case where the rotation direction of the convection flow is clockwise and the rotation direction of the monocrystalline silicon is counterclockwise, the dropping position is a third quadrant of the coordinate plane.

In the growing method for the monocrystalline silicon, it is preferable that a pulling device for the monocrystalline silicon is used, the dropping position is one of a first quadrant, a second quadrant, a third quadrant, and a fourth quadrant of a coordinate plane defined by an X-axis and the Y-axis, and in the applying of the magnetic field, the horizontal magnetic field is repeatedly applied until the dropping position gets above the region where the flow away from the straight body is dominant in the liquid surface of the silicon melt.

In the growing method for the monocrystalline silicon, it is preferable that assuming that RS denotes a radius of the straight body and Ya denotes an absolute value of a Y-axis coordinate of the dropping position, the dropping position is set to meet Ya<RS.

A pulling device for monocrystalline silicon according to another aspect of the invention, which is a pulling device for monocrystalline silicon by a Czochralski process, includes: a quartz crucible; a heating device configured to heat a silicon melt in the quartz crucible; a pulling shaft configured to pull the monocrystalline silicon so that the monocrystalline silicon is rotatable; a magnetic field application device configured to apply a horizontal magnetic field to the silicon melt; and a dopant dropping device configured to drop a granular dopant to, in a right-handed XYZ orthogonal coordinate system where a center of a liquid surface of the silicon melt corresponds to an origin, an upper side in a vertical direction corresponds to a positive direction of a Z-axis, and a horizontal magnetic field application direction corresponds to a positive direction of a Y-axis, each of a first quadrant, a second quadrant, a third quadrant, and a fourth quadrant of a coordinate plane defined by an X-axis and the Y-axis.

According to the invention, it is possible to inhibit a dropped granular dopant not yet melted from adhering to monocrystalline silicon and causing dislocation.

BRIEF EXPLANATION OF DRAWINGS

FIG. 6 is a schematic diagram showing a change in the convection flow of the silicon melt according to the exemplary embodiment of the invention.

FIG. 7 shows a dropping position in a case where the rotation direction of the convection flow is counterclockwise and the rotation direction of the monocrystalline silicon is clockwise.

DESCRIPTION OF EMBODIMENT(S)

A detailed description will be made below on a preferred exemplary embodiment of the invention with reference to the attached drawings.

Pulling Device

Figure 1:
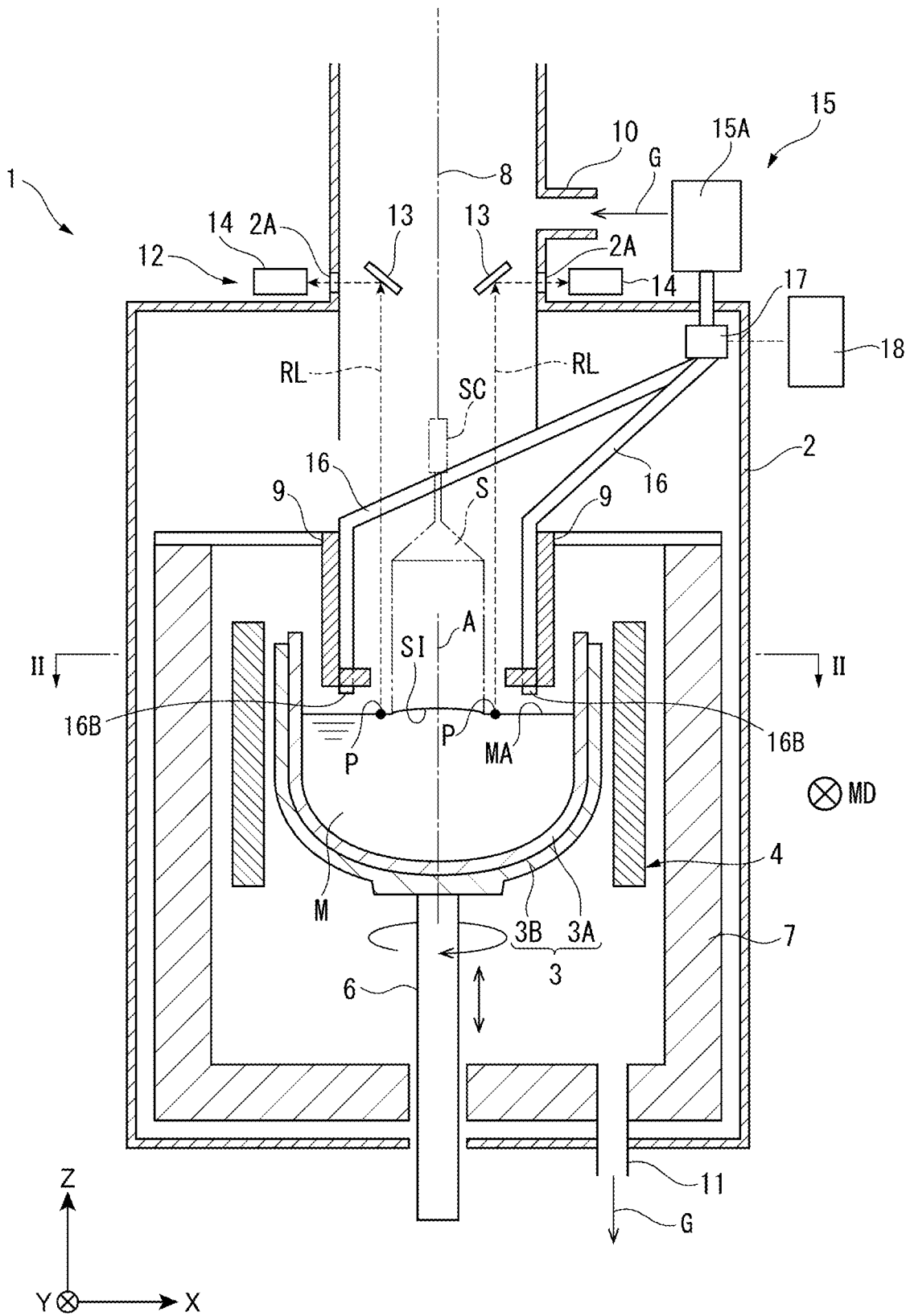
FIG. 1 is a schematic cross-sectional view of a pulling device according to an exemplary embodiment of the invention.
Figure 2:
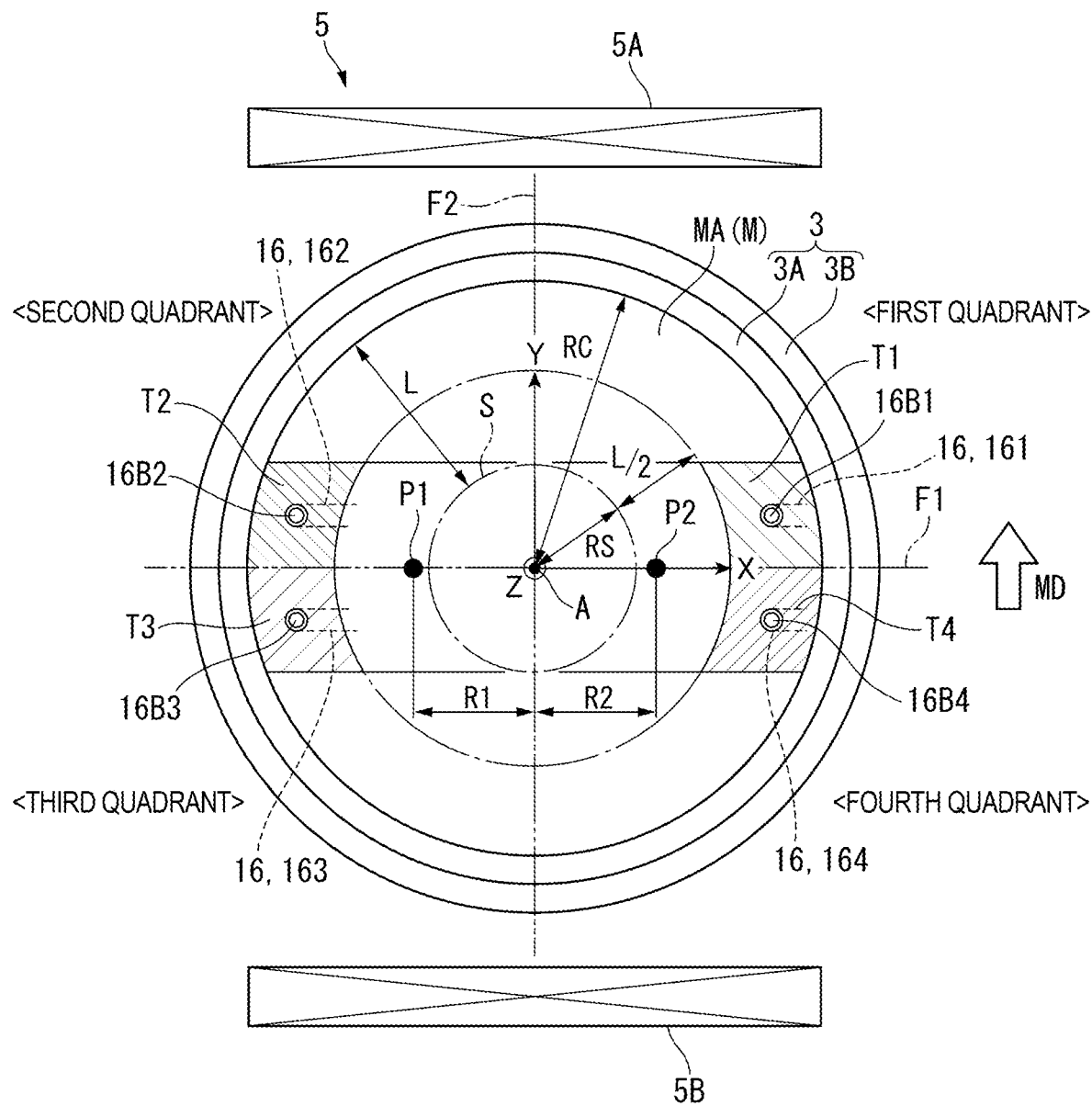
FIG. 2 is a cross-sectional view of a relevant portion of a cross section taken along a II-II line in FIG. 1.

FIG. 1 is a schematic cross-sectional view of a pulling device 1 according to an exemplary embodiment of the invention. FIG. 2 is a cross-sectional view of a relevant portion of a cross section taken along a II-II line in FIG. 1. FIG. 2 mainly shows only a crucible 3 and a magnetic field application device 5 for the purpose of simplification. In addition, X-axis, Y-axis, and Z-axis, which are orthogonal to each other, are shown in the drawings for easy understanding of a structure (also in other drawings). The X-axis and the Y-axis each correspond to a horizontal direction and the Z-axis corresponds to a vertical direction.

It should be noted that FIG. 1 is a schematic cross-sectional view of the pulling device 1 as viewed in a direction from a negative direction of the Y-axis toward a positive direction thereof and the "direction from the negative direction of the Y-axis toward the positive direction thereof" is hereinafter referred to simply as the "positive direction of the Y-axis", whereas a direction opposite thereto is a "negative direction of the Y-axis." The same applies to the other axes (X-axis and Z-axis).

The pulling device 1 is a device configured to pull and grow monocrystalline silicon S by the Czochralski process. As shown in FIG. 1 and FIG. 2, the pulling device 1 includes a chamber 2 that defines an outline, the crucible 3 located at a center portion of the chamber 2, a heater 4, the magnetic field application device 5, a dopant dropping device 15, and a control device 18.

The crucible 3 is a container circular as viewed from an upper side in a vertical direction (the negative direction of the Z-axis) and configured to store a silicon melt M. The crucible 3 has a double-layered structure including an inner quartz crucible 3A and an outer graphite crucible 3B. The crucible 3, which is rotatable and movable upward and downward, is fixed at an upper end portion of a support shaft 6 extending along the Z-axis.

The heater 4 is a heating device configured to heat the silicon melt M in the crucible 3. The heater 4, which is in a cylindrical shape, is located outside the crucible 3 coaxially with a center axis A of the crucible 3. The heater 4 is a resistance heating so-called carbon heater. A heat insulation material 7 is provided outside the heater 4 along an inner surface of the chamber 2.

The magnetic field application device 5 is a device configured to apply a horizontal magnetic field to the silicon melt M in the crucible 3. The magnetic field application device 5 of the exemplary embodiment is configured such that a horizontal magnetic field application direction (hereinafter, referred to as a magnetic field direction MD) corresponds to the positive direction of the Y-axis. A magnetic field intensity of the horizontal magnetic field is, for instance, in a range from 0.18 tesla to 0.32 tesla.

The magnetic field application device 5 includes a first magnetic body 5A and a second magnetic body 5B each in a form of an electromagnetic coil. The first magnetic body 5A and the second magnetic body 5B are provided outside the chamber 2 and opposite each other with the crucible 3 in between.

A pulling shaft 8 is located above the crucible 3 coaxially with the support shaft 6. The pulling shaft 8 is formed from a wire or the like. The pulling shaft 8 is rotatable clockwise (CW) or counterclockwise (CCW) around an axis at a predetermined speed. A seed crystal SC is attached to a lower end of the pulling shaft 8. The pulling shaft 8 causes the seed crystal SC (the monocrystalline silicon S) to rotate clockwise or counterclockwise as viewed from the upper side in the vertical direction (the negative direction of the Z-axis).

A heat shield 9 is located inside the chamber 2. The heat shield 9, which is in a cylindrical shape, surrounds the growing monocrystalline silicon S above the silicon melt M in the crucible 3.

The heat shield 9 is configured to shield the growing monocrystalline silicon S from a high-temperature radiation heat from the silicon melt M in the crucible 3 and side walls of the heater 4 and the crucible 3. For a vicinity of a solid-liquid interface SI (i.e., an interface on which the crystal grows), the heat shield 9 takes a role in controlling a temperature gradient of a central portion and an outer peripheral portion of the monocrystalline silicon in a pulling shaft direction by reducing external diffusion of heat.

An upper portion of the chamber 2 is provided with a gas inlet 10. An inert gas G such as argon gas is to be introduced into the chamber 2 through the gas inlet 10. A lower portion of the chamber 2 is provided with an exhaust outlet 11. Driving a vacuum pump (not shown) sucks gas in the chamber 2 and discharges it through the exhaust outlet 11. The inert gas G introduced into the chamber 2 thorough the gas inlet 10 flows downward between the growing monocrystalline silicon S and the heat shield 9. Subsequently, the inert gas G passes through a space between a lower end of the heat shield 9 and the liquid surface of the silicon melt M and then flows toward the outside of the heat shield 9 and, consequently, the outside of the crucible 3. The inert gas G then flows downward outside the crucible 3, being discharged through the exhaust outlet 11.

The dopant dropping device 15 is a device configured to drop a granular dopant into the silicon melt M in the crucible 3. The granular dopant, which is a dopant for doping the monocrystalline silicon S, is an additive provided by granulating a solid dopant. Examples of the type of dopant include phosphorus (P), antimony (Sb), and arsenic (As) for a case where a silicon semiconductor to be manufactured is an n-type semiconductor, whereas including boron (B) for a p-type semiconductor.

The dopant dropping device 15 includes a dopant holder 15A and a plurality of conduits 16. The dopant dropping device 15 of the exemplary embodiment includes four conduits 16 (FIG. 1 shows two of the conduits 16 only).

The dopant holder 15A is a container in which the granular dopant is held. The dopant holder 15A can be disposed, for instance, above the chamber 2 via a bracket not shown.

The conduits 16 are tubular members configured to guide the granular dopant in the dopant holder 15A to the silicon melt M. The conduits 16 each have an upper end connected to the dopant holder 15A through a dropping position selection device 17 and a lower end 16B opened above the silicon melt M. The granular dopant held in the dopant holder 15A is dropped into the silicon melt M through the conduits 16. Dropping positions of the granular dopant are positions of the lower ends 16B of the conduits 16.

The dropping position selection device 17 has a function to introduce the granular dopant delivered from the dopant holder 15A into at least one of the conduits 16. The dropping position selection device 17, which is controllable by the control device 18, may be in a form of, for instance, a plurality of electromagnetic valves.

Next, description will be made on the respective positions of the lower ends 16B of the conduits 16 (the dropping positions of the granular dopant).

As shown in FIG. 2, within a coordinate plane defined by X-axis and Y-axis of a right-handed XYZ orthogonal coordinate system in which a center of a liquid surface MA of the silicon melt M corresponds to an origin, an upper side in the vertical direction corresponds to the positive direction of the Z-axis, and the magnetic field direction MD corresponds to the positive direction of the Y-axis, the granular dopant is dropped from a first conduit 161 among the four conduits 16 to a first quadrant of the liquid surface MA of the silicon melt M.

The first quadrant is a region where a value of X and a value of Y are both positive within the coordinate plane defined by the X-axis and the Y-axis, a second quadrant is a region where a value of X is negative and a value of Y is positive within the coordinate plane defined by the X-axis and the Y-axis, a third quadrant is a region where a value of X and a value of Y are both negative within the coordinate plane defined by the X-axis and the Y-axis, and a fourth quadrant is a region where a value of X is positive and a value of Y is negative within the coordinate plane defined by the X-axis and the Y-axis.

More specifically, a lower end 16B1 of the first conduit 161 is located, within the region of the first quadrant of the liquid surface MA of the silicon melt M as viewed from the upper side (the negative direction of the Z-axis), in a region where an absolute value of a Y-axis coordinate does not exceed a radius RS of a straight body of the currently pulled monocrystalline silicon S.

In other words, assuming that RS denotes the radius of the straight body of the monocrystalline silicon S and Ya denotes the absolute value of the Y-axis coordinate of the dropping position, the dropping position of the granular dopant from the first conduit 161 is set to meet Ya<RS.

Further, assuming that L denotes a distance between an inner circumferential surface of the quartz crucible 3A and an outer circumferential surface of the monocrystalline silicon S, the lower end 16B1 of the first conduit 161 is located, as viewed from the upper side, outside a circle having a radius of RS+L/2 around the origin in the coordinate plane defined by the X-axis and the Y-axis.

That is, the dropping position of the granular dopant from the first conduit 161 is, within the first quadrant of the coordinate plane defined by the X-axis and the Y-axis, in the region where the absolute value of the Y-axis coordinate does not exceed the radius RS of the straight body of the currently pulled monocrystalline silicon S and in a region T1 outside the circle having the radius of RS+L/2 around the origin in the coordinate plane defined by the X-axis and the Y-axis.

Likewise, the dropping position of the granular dopant from the second conduit 162 (a lower end 1662 of the second conduit 162) is set, within the second quadrant of the coordinate plane defined by the X-axis and the Y-axis, in the region where an absolute value Ya of the Y-axis coordinate does not exceed the radius RS of the straight body of the currently pulled monocrystalline silicon S and in a region T2 outside the circle having the radius of RS+L/2 around the origin in the coordinate plane defined by the X-axis and the Y-axis.

The dropping position of the granular dopant from the third conduit 163 (a lower end 1683 of the third conduit 163) is set, within the third quadrant of the coordinate plane defined by the X-axis and the Y-axis, in the region where the absolute value Ya of the Y-axis coordinate does not exceed the radius RS of the straight body of the currently pulled monocrystalline silicon S and in a region T3 outside the circle having the radius of RS+L/2 around the origin in the coordinate plane defined by the X-axis and the Y-axis.

The dropping position of the granular dopant from the fourth conduit 164 (a lower end 1684 of the fourth conduit 164) is set, within the fourth quadrant of the coordinate plane defined by the X-axis and the Y-axis, in the region where the absolute value Ya of the Y-axis coordinate does not exceed the radius RS of the straight body of the currently pulled monocrystalline silicon S and in a region T4 outside the circle having the radius of RS+L/2 around the origin in the coordinate plane defined by the X-axis and the Y-axis.

The control device 18, which is electrically connected to the dropping position selection device 17, is configured to control the dropping position selection device 17 so that the granular dopant delivered from the dopant holder 15A is guided to at least one of the four conduits 16.

Figure 3:
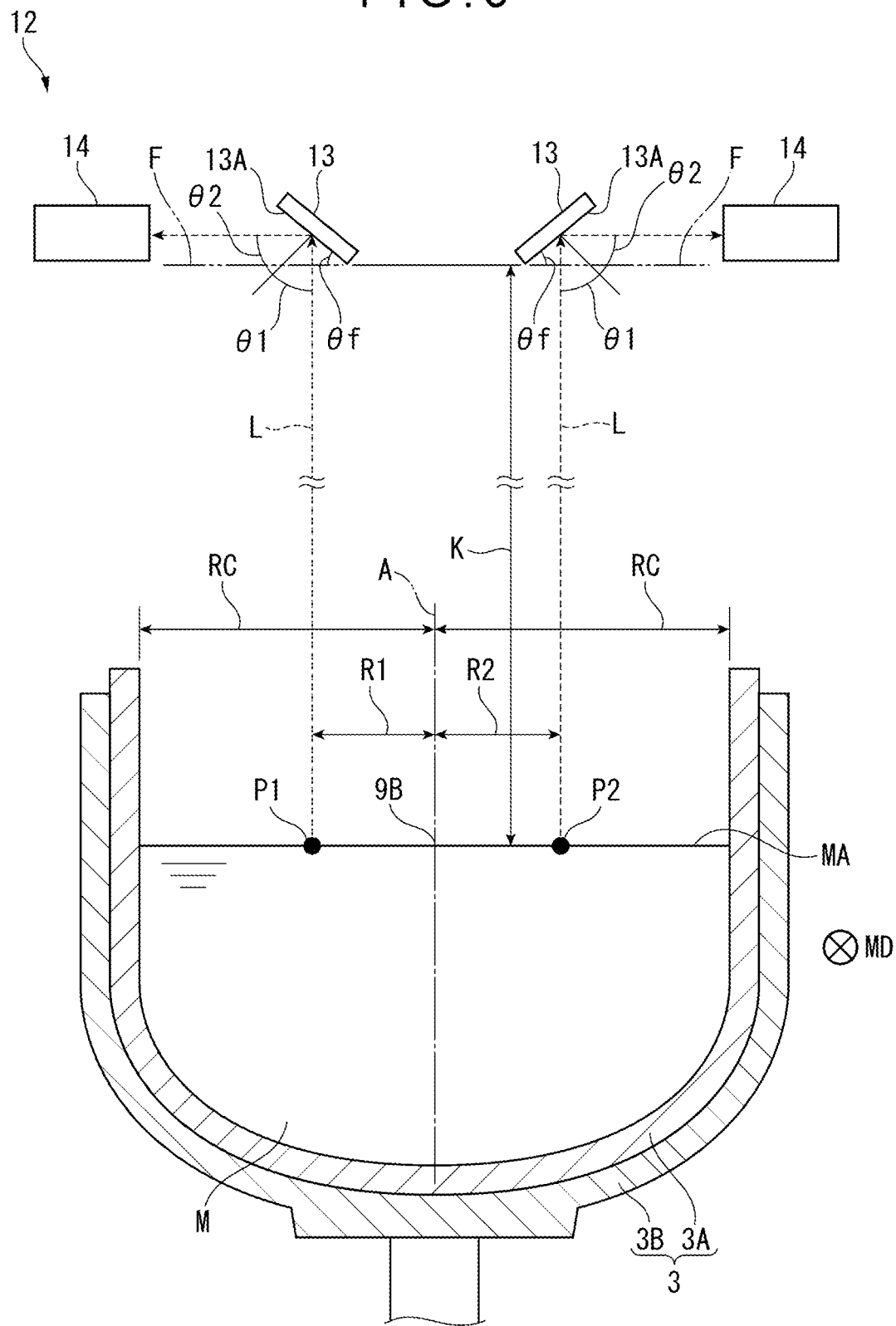
FIG. 3 is a schematic diagram showing an installation state of a temperature measurement device according to the exemplary embodiment of the invention.

The pulling device 1 includes a temperature measurement device 12 configured to measure a temperature of the liquid surface MA of the silicon melt M. The temperature measurement device 12 includes two reflectors 13 and two radiation thermometers 14 to measure two measurement point P1, P2 (P) on the liquid surface MA of the silicon melt M as shown in FIG. 1 and FIG. 3. The temperature measurement device 12 is electrically connected to the control device 18.

The reflectors 13 are arranged inside the chamber 2. It is preferable that the reflectors 13 be each arranged such that a distance (level) K from a lower end thereof to the liquid surface MA of the silicon melt M falls within a range from 600 mm to 5000 mm as shown in FIG. 3. In addition, it is preferable that the reflectors 13 be each arranged such that an angle θf between a reflection surface 13A and a horizontal plane F falls within a range from 40 degrees to 50 degrees. By virtue of such a configuration, a sum of an incidence angle θ1 and a reflection angle θ2 of a radiation light RL radiated in an opposite direction to a direction of gravitational force from each of the first and second measurement points P1, P2 falls within a range from 80 degrees to 100 degrees.

It is preferable that a silicon mirror with one surface that is mirror-polished to be the reflection surface 13A be used as each of the reflectors 13 in terms of heat resistance.

The radiation thermometers 14 are arranged outside the chamber 2. The radiation thermometers 14 are each configured to receive the radiation light RL entering through a quartz window 2A provided in the chamber 2 and measure a temperature of the measurement point P in a non-contact manner.

It should be noted that the control device 18 is connected to the heater 4, the magnetic field application device 5, the support shaft 6, etc. to control them; however, it is not described in detail.

As shown in FIG. 2, the first measurement point P1 and the second measurement point P2 are set on an imaginary plane F1 that includes the center axis A of the crucible 3 and is orthogonal to the magnetic field direction MD. The first measurement point P1 and the second measurement point P2 are set at symmetric positions with respect to the center axis A.

It is preferable that the temperature measurement device 12 be set at a position where assuming that R1 denotes a distance from the center axis A to the first measurement point P1, R2 denotes a distance from the center axis A to the second measurement point P2, and RC denotes an inner radius of the quartz crucible 3A, the first measurement point P1 satisfies Relation (1) below and the second measurement point P2 satisfies Relation (2) below.

$$0.375 \leq R1/RC < 1 \quad (1)$$

$$0.375 \leq R2/RC < 1 \quad (2)$$

A value of R1/RC and a value of R2/RC may be the same or different.

Rotation Direction of Convection Flow

Figure 4:
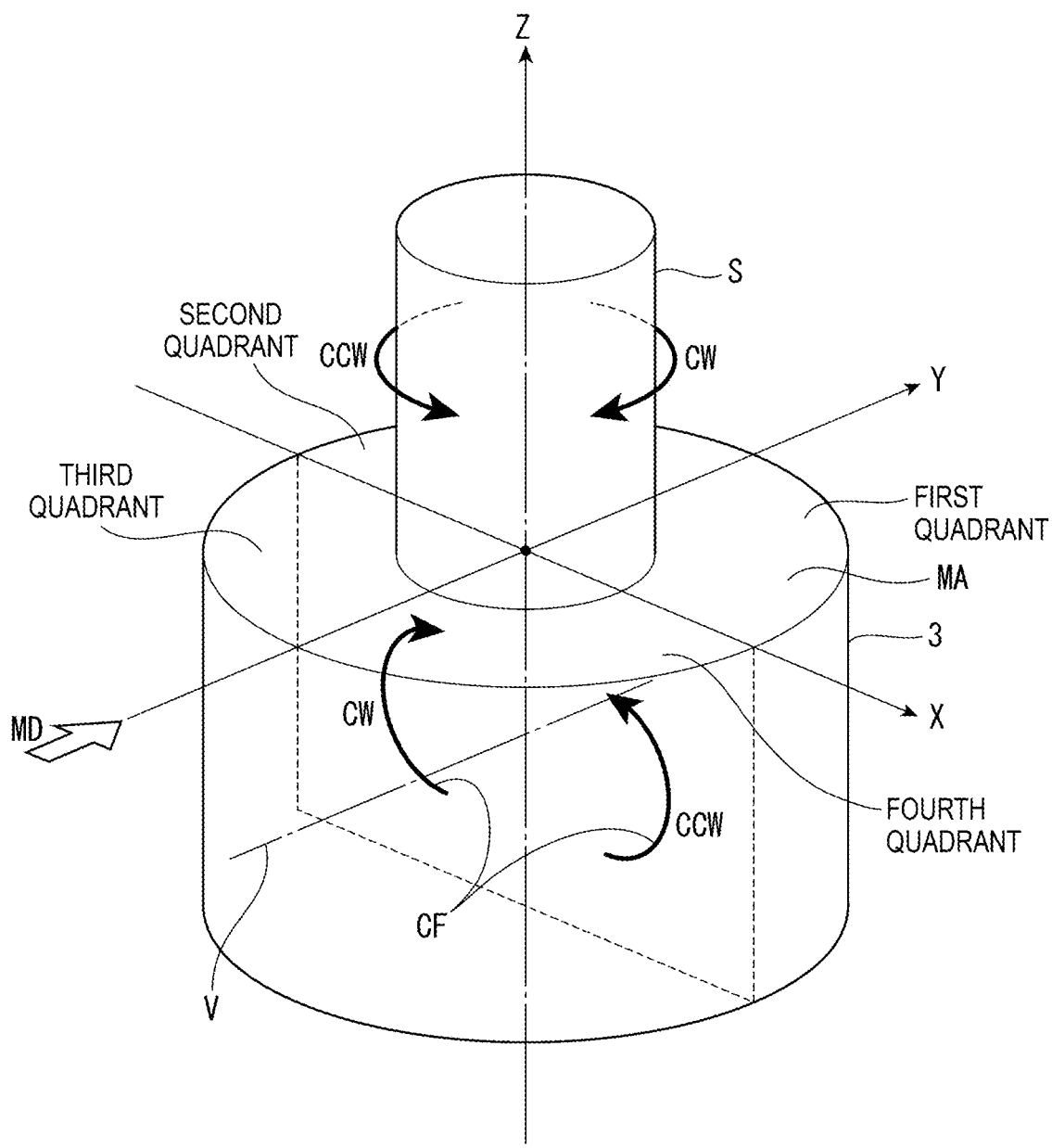
FIG. 4 is a schematic diagram for explaining a rotation direction of a convection flow and a rotation direction of monocrystalline silicon.
Figure 5A:
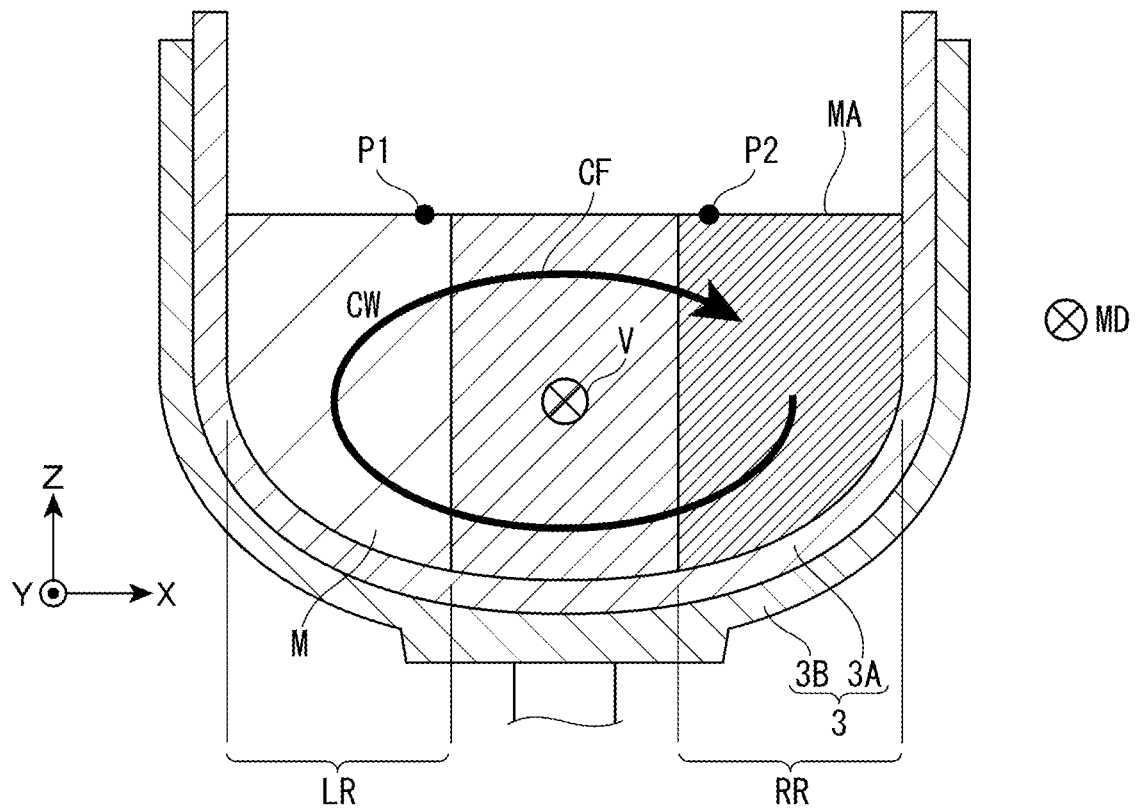
FIG. 5A is a schematic diagram showing a relationship between an application direction of a horizontal magnetic field and a direction of the convection flow of a silicon melt in the exemplary embodiment of the invention.
Figure 5B:
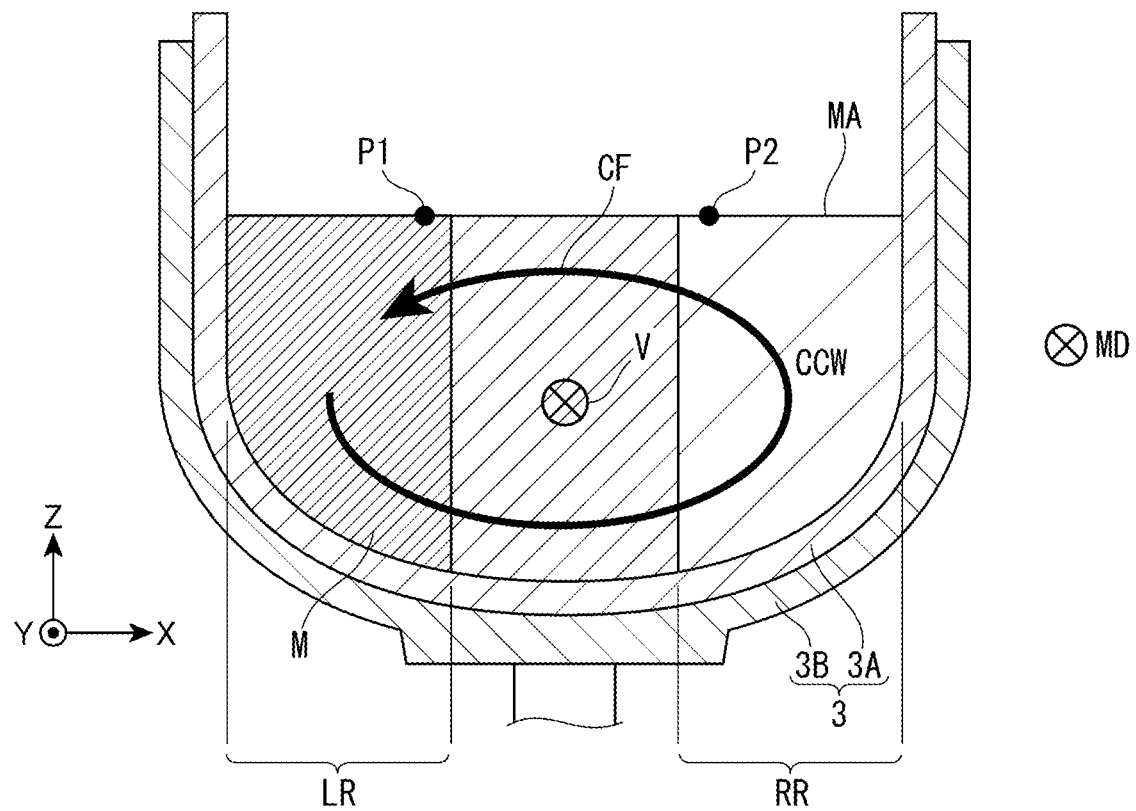
FIG. 5B is another schematic diagram showing the relationship between the application direction of the horizontal magnetic field and the direction of the convection flow of the silicon melt in the exemplary embodiment of the invention.

The inventors have found that application of a horizontal magnetic field after a solid polycrystalline silicon material is put and melt in the quartz crucible 3A causes a convection flow CF in the silicon melt M as shown in FIG. 4, FIG. 5A, and FIG. 5B. Description will be made below on a mechanism of the convection flow CF. FIG. 4 is a schematic diagram for explaining a rotation direction of the monocrystalline silicon S and a rotation direction of the convection flow CF.

The convection flow CF is a rolling flow of the silicon melt M around an imaginary axis line V that extends in the magnetic field direction MD. The convection flow CF is generated between the liquid surface MA of the silicon melt M and a bottom surface of the crucible 3. The occurrence of the convection flow CF brings the silicon melt M to a stable state.

The rotation direction of the convection flow CF has two patterns: a case where a clockwise (CW) flow becomes dominant on a magnetic-field-orthogonal cross section, which is orthogonal to the magnetic field direction MD and includes the origin, in the XYZ orthogonal coordinate system as viewed from the positive direction of the Y-axis as shown in FIG. 4 and FIG. 5A; and a case where a counterclockwise direction (CCW) becomes dominant as shown in FIG. 4 and FIG. 5B.

The inventors have speculated that the occurrence of such a phenomenon is attributed to the following mechanism.

First, in a state where the quartz crucible 3A is not rotated with no horizontal magnetic field applied, the silicon melt M is heated near an outer periphery of the quartz crucible 3A, which causes a flow in a rising direction toward the liquid surface MA from a bottom of the silicon melt M. The rising silicon melt M is cooled at the liquid surface MA of the silicon melt M and returns to the bottom of the quartz crucible 3A at a center of the quartz crucible 3A, thus causing a flow in a downward direction.

In a state where the flow rising at the peripheral portion and flowing downward at the center portion occurs, instability due to a heat convection causes a position of the downward flow to move at random to be offset from the center. Such a downward flow occurs due to a temperature distribution where a portion of the liquid surface MA of the silicon melt M corresponding to the downward flow has a lowest temperature and the temperature gradually increases toward an outer side of the liquid surface MA.

For instance, in a state of FIG. 6(A), a first region A1 with a center that is offset from a rotation center of the quartz crucible 3A is lowest in temperature and temperatures of a second region A2, a third region A3, a fourth region A4, and a fifth region A5, which are located on an outer side thereof, increase in temperature in sequence.

Then, with a horizontal magnetic field applied in the magnetic field direction MD in the state of FIG. 6(A), a rotation of a downward flow DF as viewed from above the quartz crucible 3A is gradually restrained to be restrained at a position offset in a horizontal direction orthogonal to the magnetic field direction MD as shown in FIG. 6(B).

The rotation of the downward flow DF is considered to be restrained after an intensity of a horizontal magnetic field acting on the silicon melt M exceeds a specific intensity. Accordingly, the rotation of the downward flow DF is restrained not immediately after the start of the application of the horizontal magnetic field but after the elapse of a predetermined duration of time since the start of the application.

It is reported that a flow change within the silicon melt M responsive to magnetic field application is typically represented by Magnetic Number M, that is, a dimensionless number determined by Relation (3) below (Jpn. J. Appl. Phys., Vol. 33 (1994) Part. 2 No. 4A, pp. L487-490).

Math. 1

$$M = \frac{\sigma B_0^2 h}{\rho v_0} \quad (3)$$

In Relation (3), σ donates an electrical conductivity of the silicon melt M, $B_0$ donates an applied magnetic flux density, h donates a depth of the silicon melt M, ρ donates a density of the silicon melt M, $v_0$ donates a mean flow rate of the silicon melt M with no magnetic field.

In the exemplary embodiment, a minimum value of the specific intensity of the horizontal magnetic field at which the rotation of the downward flow DF is restrained has been found to be 0.01 tesla. Magnetic Number at 0.01 tesla is 1.904. Even when an amount of the silicon melt M or a diameter of the quartz crucible 3A is different from that of the exemplary embodiment, it is considered that the restraining effect (braking effect) of the downward flow DF by the magnetic field occurs at least at the magnetic field strength (magnetic flux density) at which Magnetic Number is 1.904.

A further increase in intensity of the horizontal magnetic field from the state shown in FIG. 6(B) changes magnitudes of flows in the rising direction on right and left sides relative to the downward flow DF as shown in FIG. 6(C), causing, in FIG. 6(C), the flow in the rising direction on the left side relative to the downward flow DF to become dominant.

Eventually, with the magnetic field intensity reaching 0.2 tesla, the flow in the rising direction on the right side relative to the downward flow DF disappears to cause the flow in the rising direction on the left wide and the flow in the downward direction on the right side, thus providing the clockwise (CW) convection flow CF as shown in FIG. 6(D). In a state where the clockwise convection flow CF is provided, the temperature gradually increases from a right region RR toward a left region LR of the silicon melt M in the magnetic-field-orthogonal cross section as shown in FIG. 5A.

In contrast, with the original position of the downward flow DF in FIG. 6(A) being shifted in a rotation direction of the quartz crucible 3A by 180 degrees, the downward flow DF is restrained at a left-side position shifted in phase by 180 degrees with respect to FIG. 6(C), thus providing the counterclockwise (CCW) convection flow CF. In a state where the counterclockwise convection flow CF is provided, the temperature gradually decreases from the right region RR toward the left region LR of the silicon melt M as shown in FIG. 5B.

Such a clockwise or counterclockwise convection flow CF of the silicon melt M is maintained unless the intensity of the horizontal magnetic field becomes less than 0.2 tesla.

Growing Method for Monocrystalline Silicon

Next, description will be made on a growing method for monocrystalline silicon using the pulling device 1 for monocrystalline silicon of the exemplary embodiment. The growing method for monocrystalline silicon of the exemplary embodiment is to be performed with the dropping position of the granular dopant taken into consideration.

The growing method for monocrystalline silicon includes a heating step, a pulling step, a magnetic field application step, a temperature measurement step, a convection flow rotation direction estimation step, and a dopant dropping step in this order. It should be noted that the order of the steps may be changed, if necessary.

The heating step is a step of causing the crucible 3 to rotate with a pressure-reduced inert gas atmosphere maintained in the chamber 2, and heating the silicon melt M while melting a silicon material in the crucible 3 in a magnetic-field-free state.

The pulling step is a step of pulling the monocrystalline silicon S while rotating it.

The magnetic field application step is a step of controlling the magnetic field application device 5 with the temperature of the silicon melt M maintained and applying a horizontal magnetic field to the silicon melt M in the rotated quartz crucible 3A.

The application of the horizontal magnetic field causes, in the silicon melt M, the clockwise (CW) convection flow CF in the magnetic-field-orthogonal cross section as shown in FIG. 5A or the counterclockwise (CCW) convection flow CF as shown in FIG. 5B.

The temperature measurement step is a step of measuring, after the rotation direction of the convection flow CF is fixed, the temperature of the liquid surface MA of the silicon melt M using the temperature measurement device 12 as shown in FIG. 3, FIG. 5A, and FIG. 5B. Whether the rotation direction of the convection flow CF is fixed can be determined on the basis of, for instance, time elapsed from the start of the application of the horizontal magnetic field.

The convection flow rotation direction estimation step is a step of estimating the rotation direction of the convection flow CF on the basis of the temperature measured using the temperature measurement device 12.

The control device 18 is configured to estimate, in response to a temperature at the first measurement point P1 being higher than a temperature at the second measurement point P2, that the clockwise (CW) convection flow CF occurs in the magnetic-field-orthogonal cross section and estimate, in response to a temperature at the first measurement point P1 being lower than a temperature at the second measurement point P2, that the counterclockwise (CCW) convection flow CF occurs in the magnetic-field-orthogonal cross section.

The dopant dropping step is a step of dropping the granular dopant into the silicon melt M while the straight body of the monocrystalline silicon S is being pulled. In the dopant dropping step, the dropping position of the granular dopant is set above a region where a flow away from the straight body of the monocrystalline silicon S in the liquid surface MA of the silicon melt M is dominant. Specifically, in the dopant dropping step, the dropping position of the granular dopant is to be set in line with rules as shown in Table 1 below on the basis of the rotation direction of the monocrystalline silicon S and the rotation direction of the convection flow CF.

TABLE 1

| Rotation Direction of Convection Flow | Rotation Direction of Crystal | Quadrant to Drop |
|---|---|---|
| CW | CW | 4th |
| CCW | CCW | 1st |
| CCW | CW | 2nd |
| CW | CCW | 3rd |

Thus, in a case where the rotation direction of the convection flow CF is clockwise and the rotation direction of the monocrystalline silicon S is clockwise, the control device 18 is configured to control the dropping position selection device 17 to cause the granular dopant to be introduced into the fourth conduit 164. This causes the dropping position of the granular dopant to be set, within the fourth quadrant of the coordinate plane defined by the X-axis and the Y-axis, in the region where the absolute value of the Y-axis coordinate does not exceed the radius RS of the straight body of the currently pulled monocrystalline silicon S and in the region T4 outside the circle having the radius of RS+L/2 around the origin in the coordinate plane defined by the X-axis and the Y-axis.

In a case where the rotation direction of the convection flow CF is counterclockwise and the rotation direction of the monocrystalline silicon S is counterclockwise, the control device 18 is configured to control the dropping position selection device 17 to cause the granular dopant to be introduced into the first conduit 161. This causes the dropping position of the granular dopant to be set, within the first quadrant of the coordinate plane defined by the X-axis and the Y-axis, in the region where the absolute value of the Y-axis coordinate does not exceed the radius RS of the straight body of the currently pulled monocrystalline silicon S and in the region T1 outside the circle having the radius of RS+L/2 around the origin in the coordinate plane defined by the X-axis and the Y-axis.

In a case where the rotation direction of the convection flow CF is counterclockwise and the rotation direction of the monocrystalline silicon S is clockwise, the control device 18 is configured to control the dropping position selection device 17 to cause the granular dopant to be introduced into the second conduit 162. This causes the dropping position of the granular dopant to be set, within the second quadrant of the coordinate plane defined by the X-axis and the Y-axis, in the region where the absolute value of the Y-axis coordinate does not exceed the radius RS of the straight body of the currently pulled monocrystalline silicon S and in the region T2 outside the circle having the radius of RS+L/2 around the origin in the coordinate plane defined by the X-axis and the Y-axis.

In a case where the rotation direction of the convection flow CF is clockwise and the rotation direction of the monocrystalline silicon S is counterclockwise, the control device 18 is configured to control the dropping position selection device 17 to cause the granular dopant to be introduced into the third conduit 163. This causes the dropping position of the granular dopant to be set, within the third quadrant of the coordinate plane defined by the X-axis and the Y-axis, in the region where the absolute value of the Y-axis coordinate does not exceed the radius RS of the straight body of the currently pulled monocrystalline silicon S and in the region T3 outside the circle having the radius of RS+L/2 around the origin in the coordinate plane defined by the X-axis and the Y-axis.

Subsequently, the granular dopant is dropped from the set dropping position (conduit 16) and the dopant is added to the silicon melt M.

Next, description will be made on an effect of the above-described exemplary embodiment. Description will be made below on an effect of the dropping position being the region T2 in a case where the rotation direction of the convection flow CF is counterclockwise (CCW) and the rotation direction RD of the monocrystalline silicon S is clockwise (CW) as shown in FIG. 7.

Figure 8:
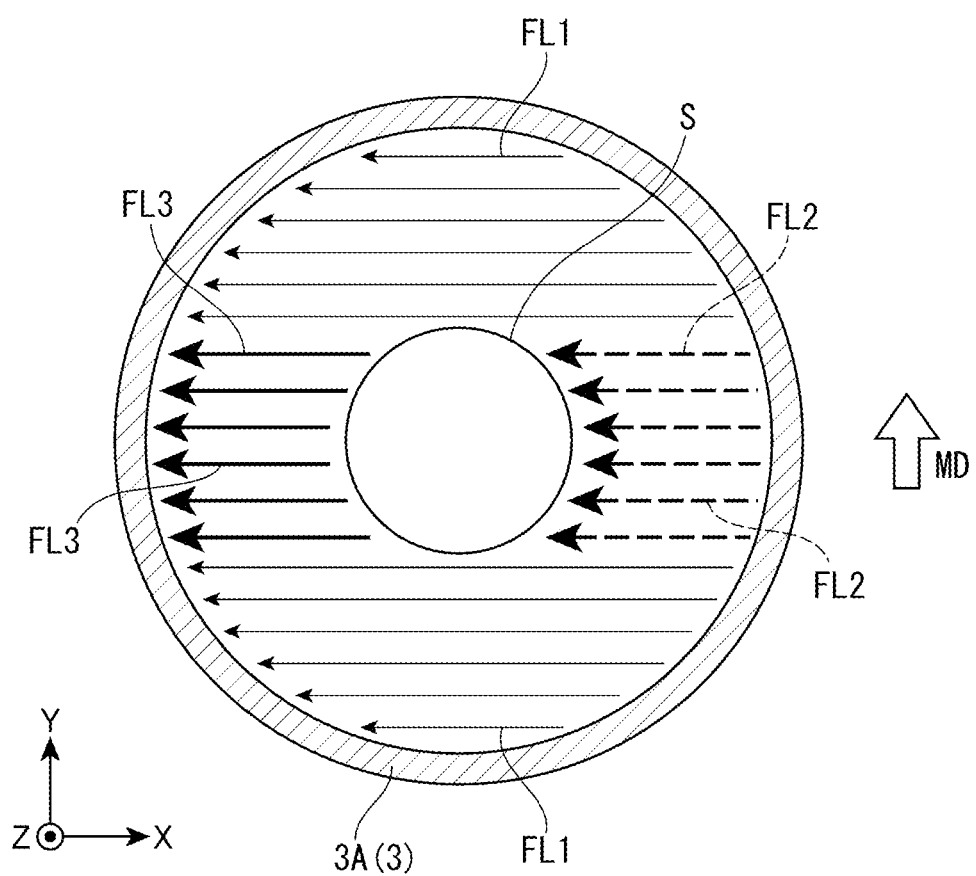
FIG. 8 is a diagram for explaining a flow on a liquid surface of the silicon melt in a case where the rotation direction of the convection flow is counterclockwise.

Assuming that the rotation direction of the convection flow CF is counterclockwise, flows shown by arrows FL1 to FL3 in FIG. 8 occur on the liquid surface MA of the silicon melt M. Among the above, the flow shown by the arrow FL2 is a flow toward the monocrystalline silicon S and the flow shown by the arrow FL3 is a flow away from the monocrystalline silicon S.

Here, in a case where the granular dopant is dropped into the flow shown by the arrow FL2, an unmelted granular dopant may reach the monocrystalline silicon S. The unmelted granular dopant reaching the monocrystalline silicon S becomes a cause of dislocation.

In contrast, in a case where the granular dopant is dropped into the flow shown by the arrow FL3, the granular dopant flows toward an inner wall surface of the crucible 3 instead of being directed toward the monocrystalline silicon S, then flowing to sink toward the bottom surface of the crucible 3. This makes it possible to inhibit the unmelted granular dopant from reaching the monocrystalline silicon S.

In addition, assuming that the rotation direction RD of the monocrystalline silicon S is clockwise as viewed from the upper side in the vertical direction, it is preferable that the dropping position of the granular dopant be the second quadrant. This is because when the granular dopant is dropped into the second quadrant, the granular dopant flows in a direction away from the monocrystalline silicon S with a flow resulting from the rotation of the monocrystalline silicon S.

Further, it is preferable that the dropping position of the granular dopant be distant from the outer circumferential surface of the monocrystalline silicon S. If the dropping position of the granular dopant is close to the monocrystalline silicon S, the unmelted granular dopant may reach the monocrystalline silicon S.

Accordingly, by virtue of the region T2 being set outside the circle having the radius of RS+L/2 around the origin as shown in FIG. 7, the unmelted granular dopant can likewise be inhibited from reaching the monocrystalline silicon S.

It should be noted that the dropping position is not limited to the region T2 shown in FIG. 7. It means that the region may be changed, if necessary, as long as being above the region where a flow away from the straight body of the monocrystalline silicon S is dominant in the liquid surface MA of the silicon melt M. For instance, the granular dopant may be dropped to a position closer to the monocrystalline silicon S than the region T2 shown in FIG. 7.

In addition, by virtue of the four conduits 16, the pulling device 1 of the exemplary embodiment more reliably allows the dropping position to be the region where a flow of the silicon melt M in a direction away from the straight body is dominant.

Other Exemplary Embodiments

In the above-described exemplary embodiment, a device including the plurality of conduits 16 and capable of dropping the granular dopant to all of the quadrants of the first quadrant to the fourth quadrant is used as the dopant dropping device 15. The invention, however, is not limited thereto.

The dopant dropping device 15 may be, for instance, in the form of a device including two conduits 16 and be configured to set the dropping position of the granular dopant on the basis of only the rotation direction of the convection flow CF. In other words, it is not indispensable that the device is capable of dropping the granular dopant to all of the quadrants of the first quadrant to the fourth quadrant.

In addition, a single movable conduit 16 may be provided so as to move to a desired quadrant position.

In addition, the dopant dropping device 15 may be in the form of, for instance, a device that includes a single conduit 16 and is configured to drop the granular dopant to only one of the first quadrant to the fourth quadrant.

In a case where the pulling device in such a form is used to drop the granular dopant while the monocrystalline silicon S is being pulled, it is only necessary that a horizontal magnetic field is repeatedly applied by the magnetic field application device 5 until the dropping position is above a region where a flow away from the straight body of the monocrystalline silicon S is dominant in the liquid surface MA of the silicon melt M.

EXAMPLES

Next, description will be made on Examples and Comparative Examples of the invention. It should be noted that the invention is not limited to Examples.

In Examples and Comparative Examples, the granular dopant was dropped into the silicon melt M by using the dopant dropping device 15 while the monocrystalline silicon S having a diameter of 300 mm was being pulled by using the pulling device 1 as shown in FIG. 1 and a dislocation rate of the monocrystalline silicon S was compared.

Evaluation

In Examples 1 to 4 where the dropping position of the granular dopant was set with the rotation direction of the convection flow CF and the rotation direction of the monocrystalline silicon S taken into consideration as in the exemplary embodiment of the invention, the dislocation rate was significantly lower than those in Comparative Examples 1 to 4 where the dropping position of the granular dopant was set without taking the rotation direction of the convection flow CF and the rotation direction of the monocrystalline silicon S into consideration.

In view of the above, it has been demonstrated that the dislocation rate can be reduced by virtue of the dropping position of the granular dopant being set above a region where a flow away from the straight body of the monocrystalline silicon S is dominant in the liquid surface MA of the silicon melt M with the rotation direction of the convection flow CF and the rotation direction of the monocrystalline silicon S taken into consideration.

TABLE 2

|  | Rotation Direction of Convection Flow | Rotation Direction of Crystal | Dropping Position (Quadrant) | Dropping Position (Y-Coordinate) | Dislocation Rate (%) |
| --- | --- | --- | --- | --- | --- |
| Ex. 1 | CW | CW | 4th | −200 | 7 |
| Ex. 2 | CCW | CW | 2nd | 250 | 8 |
| Ex. 3 | CW | CCW | 3rd | −300 | 5 |
| Ex. 4 | CCW | CCW | 1st | 350 | 5 |
| Comp. 1 | CW | CW | 3rd | −200 | 65 |
| Comp. 2 | CCW | CW | 3rd | −250 | 81 |
| Comp. 3 | CW | CCW | 4th | −300 | 81 |
| Comp. 4 | CCW | CCW | 2nd | 350 | 23 |

Examples 1 to 4/Comparative Examples 1 to 4

In Examples 1 to 4, the dropping position of the granular dopant was the same as that of the exemplary embodiment.

In Comparative Examples 1 to 4, the dropping position of the granular dopant was different from that of the exemplary embodiment. By way of example, in a case where the rotation direction of the convection flow CF was clockwise and the rotation direction of the monocrystalline silicon S was clockwise, the granular dopant was dropped to the fourth quadrant in Example 1, whereas the granular dopant was dropped to the third quadrant in Comparative Example 1.

In addition, in Examples 1 to 4 and Comparative Examples 1 to 4, the absolute value of the Y-axis coordinate of the dropping position was set larger than the radius of the monocrystalline silicon S. It means that in Examples 1 to 4 and Comparative Examples 1 to 4, the granular dopant was dropped into the flow shown by the arrow FL1 shown in FIG. 8.

Examples 5 to 8/Comparative Examples 5 to 8

In Examples 5 to 8, the dropping position of the granular dopant was the same as that of the exemplary embodiment.

In Comparative Examples 5 to 8, the dropping position of the granular dopant was different from that of the exemplary embodiment.

In addition, in Examples 5 to 8 and Comparative Examples 5 to 8, the dropping position was set so that the absolute value of the Y-axis coordinate of the dropping position did not exceed the radius of the monocrystalline silicon S. It means that in Examples 5 to 8 and Comparative Examples 5 to 8, the granular dopant was dropped to the flows shown by the arrows FL2, FL3 in FIG. 8.

Evaluation

The dislocation rate was reduced by virtue of the rotation direction of the convection flow CF and the rotation direction of the monocrystalline silicon S being taken into consideration as in Examples 1 to 4/Comparative Examples 1 to 4. In addition, by virtue of the dropping position being set so that the absolute value of the Y-axis coordinate of the dropping position did not exceed the radius of the monocrystalline silicon S, a further reduction in dislocation rate was achieved.

TABLE 3

|  | Rotation Direction of Convection Flow | Rotation Direction of Crystal | Dropping Position (Quadrant) | Dropping Position (Y-Coordinate) | Dislocation Rate (%) |
| --- | --- | --- | --- | --- | --- |
| Ex. 5 | CW | CW | 4th | −100 | 3 |
| Ex. 6 | CCW | CW | 2nd | 100 | 5 |

TABLE 3-continued

| | Rotation Direction of Convection Flow | Rotation Direction of Crystal | Dropping Position (Quadrant) | Dropping Position (Y-Coordinate) | Dislocation Rate (%) |
|---|---|---|---|---|---|
| Ex. 7 | CW | CCW | 3rd | −50 | 4 |
| Ex. 8 | CCW | CCW | 1st | 25 | 4 |
| Comp. 5 | CW | CW | 1st | 100 | 51 |
| Comp. 6 | CCW | CW | 1st | 100 | 23 |
| Comp. 7 | CW | CCW | 4th | −50 | 36 |
| Comp. 8 | CCW | CCW | 2nd | 25 | 21 |

The invention claimed is:

1. A growing method for monocrystalline silicon by a Czochralski process, the growing method comprising:

pulling the monocrystalline silicon directly from a silicon melt contained within a crucible while rotating the monocrystalline silicon; and dropping a granular dopant directly onto a liquid surface of the silicon melt while a straight body of the monocrystalline silicon is being pulled, wherein in the dropping of the dopant, a dropping position of the granular dopant is set above a region where a flow away of the silicon melt contained within the crucible from the straight body is dominant in the liquid surface of the silicon melt;

the growing method further comprising applying a horizontal magnetic field to the silicon melt, wherein in the dropping of the dopant, in a state where in a right-handed XYZ orthogonal coordinate system where a center of the liquid surface of the silicon melt corresponds to an origin, an upper side in a vertical direction corresponds to a positive direction of a Z-axis, and a horizontal magnetic field application direction corresponds to a positive direction of a Y-axis, on a magnetic-field-orthogonal cross section including the origin and orthogonal to the horizontal magnetic field application direction, there is a convection flow having a clockwise or counterclockwise rotation direction as viewed from the positive direction of the Y-axis, the dropping position of the granular dopant is set based on a rotation direction of the monocrystalline silicon and the rotation direction of the convection flow as viewed from the upper side in the vertical direction.

2. The growing method for the monocrystalline silicon according to claim 1, wherein in the dropping of the dopant, in a case where the rotation direction of the convection flow is clockwise and the rotation direction of the monocrystalline silicon is clockwise, the dropping position is a fourth quadrant of a coordinate plane defined by an X-axis and the Y-axis, in a case where the rotation direction of the convection flow is counterclockwise and the rotation direction of the monocrystalline silicon is counterclockwise, the dropping position is a first quadrant of the coordinate plane, in a case where the rotation direction of the convection flow is counterclockwise and the rotation direction of the monocrystalline silicon is clockwise, the dropping position is a second quadrant of the coordinate plane, and in a case where the rotation direction of the convection flow is clockwise and the rotation direction of the monocrystalline silicon is counterclockwise, the dropping position is a third quadrant of the coordinate plane.

3. The growing method for the monocrystalline silicon according to claim 1, wherein a pulling device for the monocrystalline silicon is used, the dropping position is one of a first quadrant, a second quadrant, a third quadrant, and a fourth quadrant of a coordinate plane defined by an X-axis and the Y-axis, and in the applying of the magnetic field, the horizontal magnetic field is repeatedly applied until the dropping position gets above the region where the flow away from the straight body is dominant in the liquid surface of the silicon melt.

4. The growing method for the monocrystalline silicon according to claim 2, wherein assuming that RS denotes a radius of the straight body and Ya denotes an absolute value of a Y-axis coordinate of the dropping position, the dropping position is set to meet Ya<RS.

5. A pulling device for monocrystalline silicon by a Czochralski process, the pulling device comprising:

a quartz crucible;

a heating device configured to heat a silicon melt in the quartz crucible;

a pulling shaft configured to pull the monocrystalline silicon so that the monocrystalline silicon is rotatable;

a magnetic field application device configured to apply a horizontal magnetic field to the silicon melt; and a dopant dropping device configured to drop a granular dopant to, in a right-handed XYZ orthogonal coordinate system where a center of a liquid surface of the silicon melt corresponds to an origin, an upper side in a vertical direction corresponds to a positive direction of a Z-axis, and a horizontal magnetic field application direction corresponds to a positive direction of a Y-axis, each of a first quadrant, a second quadrant, a third quadrant, and a fourth quadrant of a coordinate plane defined by an X-axis and the Y-axis.

6. The growing method for the monocrystalline silicon according to claim 3, wherein assuming that RS denotes a radius of the straight body and Ya denotes an absolute value of a Y-axis coordinate of the dropping position, the dropping position is set to meet Ya<RS.

7. The growing method for the monocrystalline silicon according to claim 1, wherein the dopant is selected from the group consisting of phosphorus, antimony, arsenic, and boron.

* * * * *

UNITED STATES PATENT AND TRADEMARK OFFICE
CERTIFICATE OF CORRECTION

| | | |
|---|---|---|
| PATENT NO. | : 12,157,953 B2 | Page 1 of 1 |
| APPLICATION NO. | : 17/640054 | |
| DATED | : December 3, 2024 | |
| INVENTOR(S) | : Norihito Fukatsu et al. | |

It is certified that error appears in the above-identified patent and that said Letters Patent is hereby corrected as shown below:

On the Title Page

Item [54], and in the Specification Column 1 Line 1 change "INHIBITING DRIPPED" to
-- INHIBITING DROPPED --

Signed and Sealed this
Eighteenth Day of March, 2025

Coke Morgan Stewart
*Acting Director of the United States Patent and Trademark Office*